(12) United States Patent
Huang et al.

(10) Patent No.: US 8,878,555 B2
(45) Date of Patent: Nov. 4, 2014

(54) CAPACITANCE MEASUREMENT DEVICE FOR A TOUCH CONTROL DEVICE

(75) Inventors: He-Wei Huang, Hsinchu (TW);
Chun-Hung Chen, Taipei (TW);
Chih-Yuan Chang, Changhua County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 712 days.

(21) Appl. No.: 13/046,780

(22) Filed: Mar. 14, 2011

(65) Prior Publication Data

US 2011/0273192 A1    Nov. 10, 2011

(30) Foreign Application Priority Data

May 7, 2010  (TW) .............................. 99114655 A

(51) Int. Cl.
*G01R 27/26* (2006.01)
*H03K 17/96* (2006.01)
*G06F 3/044* (2006.01)

(52) U.S. Cl.
CPC .............. *G06F 3/044* (2013.01); *H03K 17/962* (2013.01); *H03K 2217/960725* (2013.01)
USPC ............ 324/678; 345/173; 345/174; 324/686

(58) Field of Classification Search
USPC ......................................................... 324/678
See application file for complete search history.

(56) References Cited

U.S. PATENT DOCUMENTS

| | | | |
|---|---|---|---|
| 5,329,239 A * | 7/1994 | Kindermann et al. | ........ 324/678 |
| 5,444,378 A | 8/1995 | Rogers | |
| 7,504,833 B1 | 3/2009 | Seguine | |
| 7,705,567 B2 | 4/2010 | Okamura | |
| 8,018,238 B2 * | 9/2011 | Cormier, Jr. | .................. 324/678 |
| 8,072,230 B1 | 12/2011 | Seguine | |
| 8,363,033 B2 | 1/2013 | Chen | |
| 8,497,690 B2 * | 7/2013 | Bartling et al. | ............... 324/678 |
| 2007/0279010 A1 | 12/2007 | Okamura | |

(Continued)

FOREIGN PATENT DOCUMENTS

| | | |
|---|---|---|
| CN | 101477152 A | 7/2009 |
| TW | 200951459 | 12/2009 |
| TW | 201017495 | 5/2010 |

OTHER PUBLICATIONS

Huang et al., Title: Touch Detection Method and Related Touch Control Device, pending U.S. Appl. No. 13/046,783, filed Mar. 14, 2011.

*Primary Examiner* — Benjamin M Baldridge
(74) *Attorney, Agent, or Firm* — Winston Hsu; Scott Margo

(57) ABSTRACT

A capacitance measurement device includes a charging control unit for charging a measured capacitor, a discharging control unit for discharging the measured capacitor, a first switch coupled to the measured capacitor and the charging control unit for controlling a connection between the measured capacitor and the charging control unit according to a first switching signal, a second switch coupled to the measured capacitor and the discharging control unit for controlling a connection between the measured capacitor and the discharging control unit according to a second switching signal, a first A/D converter coupled to the measured capacitor for converting a voltage signal on the measured capacitor into a first signal, and a duty cycle detecting circuit coupled to the measured capacitor for converting the voltage signal on the measured capacitor into a count value that represents the capacitance of the measured capacitor and outputting the count value to a processing unit.

19 Claims, 14 Drawing Sheets

(56) References Cited

U.S. PATENT DOCUMENTS

| | | | |
|---|---|---|---|
| 2008/0061800 A1* | 3/2008 | Reynolds et al. | 324/678 |
| 2008/0179112 A1* | 7/2008 | Qin et al. | 178/18.06 |
| 2008/0297175 A1* | 12/2008 | Wu | 324/686 |
| 2009/0174416 A1* | 7/2009 | Ely et al. | 324/678 |
| 2010/0079406 A1* | 4/2010 | Chen et al. | 345/174 |
| 2010/0097077 A1* | 4/2010 | Philipp et al. | 324/678 |
| 2010/0102832 A1* | 4/2010 | Bartling et al. | 324/679 |
| 2010/0231241 A1* | 9/2010 | Mueck et al. | 324/686 |
| 2010/0259283 A1* | 10/2010 | Togura | 324/679 |
| 2011/0115717 A1 | 5/2011 | Hable | |
| 2011/0133757 A1* | 6/2011 | Chae et al. | 324/678 |
| 2011/0163766 A1 | 7/2011 | Geaghan | |
| 2011/0187389 A1* | 8/2011 | Han et al. | 324/679 |
| 2012/0001551 A1 | 1/2012 | Abe | |
| 2012/0043970 A1* | 2/2012 | Olson | 324/601 |

\* cited by examiner

CAPACITANCE MEASUREMENT DEVICE FOR A TOUCH CONTROL DEVICE

BACKGROUND OF THE INVENTION

1. Field of the Invention

The present invention relates to a capacitance measurement device for a touch control device, and more particularly, to a capacitance measurement device that precisely measures the capacitance of a measured capacitor in a touch control device.

2. Description of the Prior Art

A touchscreen is an LCD screen combined with a touch panel, widely applied in a variety of consumer electronics as a user interface. A projected capacitive touch technology permits higher sensibility, durability and multi-touch operation and is popularly used in touch panels. Please refer to FIG. 1, which is a schematic diagram of a touch control device 10 according to the prior art. The touch control device 10 comprises a touch panel 100, a multiplexer 102, a capacitance measurement device 104, a processing unit 106, and a memory 108. The touch panel 100 is a projected capacitive touch panel consisting of intersecting Indium Tin Oxide (ITO) traces that act as row and column electrodes. Each trace is equivalent to an RC circuit composed of a resistor and a capacitor. When a user touches or approaches the touch panel 100, a human body capacitor may be coupled to the touched trace and thus the capacitance of the trace changes. In other words, the touched trace is regarded as a measured capacitor for the capacitance measurement device 104. The multiplexer 102 is coupled to all traces of the touch panel 100 and is utilized for conducting a connection between each trace and the capacitance measurement device 104. In other words, the capacitance measurement device 104 scans the touch panel 100 through the multiplexer 102 for detecting if a touch happens. The capacitance measurement device 104 converts the capacitance of the measured capacitor into a recordable value as an analog voltage or a digital count value, outputted to the processing unit 106.

When the touch panel 100 is not touched, the capacitor of each trace is regarded as an environment capacitor. The capacitance of the environment capacitor is also measured and converted into a base count value by the capacitance measurement device 104, and is stored in the memory 108. Touch panels of different characteristics may have different capacitance of the environment capacitor. Whether the measured capacitance of the environment capacitor is accurate influences touch detection. When the touch panel 100 is touched, a human body capacitor is coupled to the measured capacitor and the capacitance of the measured capacitor changes. The processing unit 106 compares a new count value generated by the capacitance measurement device 104 with the base count value and thereby determines if the touch panel 100 is touched.

There are several ways for the capacitance measurement device 104 to measure the capacitance of the measured capacitor. A simple way is to connect the measured capacitor and a resistor or a current source and use the principle of RC time constant to measure a charging/discharging period, for estimating the capacitance of the measured capacitor. Note that, the capacitor of each trace when the touch panel 100 is not touched is of a very small capacitance around tens to hundreds picofarad (pF). For this reason, when the measured capacitor is an environment capacitor, the charging/discharging period is short, which may result in a large measurement error. Another way to measure the capacitance of the measured capacitor is called charge transfer, which is to transfer electric charges from the measured capacitor to an integrating capacitor of a larger capacitance by one or more than one times until the voltage on the integrating capacitor reaches a predetermined voltage and then discharge the integrating capacitor, to estimate the capacitance of the measured capacitor. Since the method of charge transfer measures the capacitance of the measured capacitance only according to the charging period of the integrating capacitor, measurement is not efficient enough.

Another conventional method, called delta-sigma method, combines the principle of RC time constant and the method of charge transfer. Please refer to FIG. 2, which is a schematic diagram of a capacitance measurement device 20 based on the delta-sigma method according to the prior art. The capacitance measurement device 20 can be used as the capacitance measurement device 104 of the touch control device 10 of FIG. 1. The capacitance measurement device 20 comprises an integrating capacitor 200, a discharging circuit 202, a comparator 204, a digital signal processing unit 206, and switches SW1 and SW2. Please refer to FIG. 3, which is a timing diagram of signals with respect to the capacitance measurement device 20 performing a charging and discharging procedure. FIG. 2 illustrates waveforms of a signal S1 controlling the switch SW1, a signal S2 controlling the switch SW2, the voltage signal $V_{CM}$ on the integrating capacitor 200, and a signal SB outputted from the comparator 204, respectively depicted by a dashed line for the case of a larger capacitance of the measured capacitor 22 and a solid line for the case of a smaller capacitance of the measured capacitor 22.

The signals S1 and S2 respectively control the switches SW1 and SW2 to be turned on at different time. When the switch SW1 is turned off and the switch SW2 is turned on, the voltage source $V_{CC}$ charges the measured capacitor 22; when the switch SW1 is turned on and the switch SW2 is turned off, electric charge stored on the measured capacitor 22 is transferred to the integrating capacitor 200. When charge transfer is ongoing, the comparator 204 compares the voltage level of the voltage signal $V_{CM}$ with a reference voltage $V_{REF}$ and outputs a signal SB as a comparison result. At the same time, the digital signal processing unit 206 converts the signal SB into a count value Dx. When the voltage level of the voltage signal $V_{CM}$ is large than the reference voltage $V_{REF}$, the signal SB controls the discharging circuit 202 to discharge the integrating capacitor 200. When the measured capacitor 22 is of a large capacitance, electric charge transferred to the integrating capacitor 200 is also a large amount and therefore the duty cycle of the signal SB is high.

Briefly, the capacitance measurement device 20 uses the duty cycle of the signal SB to represent the capacitance of the measured capacitor 22, and converts the signal SB into the digital count value Dx outputted to a rear-stage circuit, so that capacitance variance of the measured capacitor 22 can be determined. Compared to the capacitance measurement by charging/discharging periods or charge transfer previously mentioned, when the measured capacitor is the environment capacitor which is of a small value, the capacitance measurement device 20 obtains a more precise capacitance and has a higher efficiency. However, the capacitance measurement device 20 still has some disadvantages as follows.

The capacitance measurement device 20 uses the measured capacitor 22 of an unknown capacitance to charge the integrating capacitor 200 of a fixed capacitance. In order to estimate touch panels of different characteristics, the capacitance of the integrating capacitor 200 has to be tens of nanofarad (nF), which is far larger larger than the capacitance of the measured capacitor 22 and costs a lot, whatever the integrating capacitor 200 is integrated into an application specified integrated circuit (ASIC) of the capacitance measurement device 20 or is an external component for the capacitance measurement device 20. Moreover, the integrating capacitor 200 is easily interfered with the electromagnetic signals when it is an external component, which may result in instability of the voltage signal $V_{CM}$ on the integrating capacitor 200 and generate noise in the signal SB that influences capacitance measurement accuracy.

In practice, when the discharging period of the integrating capacitor 200 is finished, the voltage level of the voltage signal $V_{CM}$ has to return to an initial voltage level for a next charging period, which intends that the discharging capacity has to be greater than the charging capacity. When the capacitance of the measured capacitor 22 is a large value, electric charge transferred from the measured capacitor 22 to the integrating capacitor 200 is also a large amount. In this situation, if the discharging period for the discharging circuit 202 to discharge the integrating capacitor 200 is not long enough, the voltage signal $V_{CM}$ on the integrating capacitor 200 may have no way to return to the initial voltage level. As a result, the voltage level of the voltage signal $V_{CM}$ accumulates during every charging period. Please refer to FIG. 4, which is a timing diagram of signals with respect to the capacitance measurement device 20 performing a charging and discharging procedure. As shown in FIG. 4, when the discharging period for the discharging circuit 202 is not long enough, the voltage level of the voltage signal $V_{CM}$ accumulates to be the highest voltage level as that of the full-charged measured capacitor 22. In this situation, electric charge stored on the measured capacitor 22 is not transferred to the integrating capacitor 200 and the capacitance measurement device 20 does not work normally. The above problems of the voltage level accumulating may also occur when the charging capacity is greater than the discharging capacity due to environment variance.

When the capacitance of the measured capacitor 22 is far less than the capacitance of the integrating capacitor 200, the voltage level of the voltage signal $V_{CM}$ varies slightly after charge transfer, which intends that the discharging capacity is comparatively larger than the charging capacity. In this situation, it takes more time to charge the integrating capacitor 200 to make the voltage signal $V_{CM}$ reach a voltage level high enough for capacitance measurement. On the other hand, when a short discharging period is used, the capacitance variance of the measured capacitor 22 cannot be measured precisely.

Since the charging or discharging capacity cannot be adjusted in the conventional capacitance measurement devices, the conventional capacitance measurement devices cannot achieve the same measurement accuracy when measuring touch panels of different characteristics. Besides, the conventional capacitance measurement devices and methods cannot renew the environment capacitance. As a result, when a touch panel used for a long time is touched, or a touch panel in an environment with various factors is touched, the rear-stage circuit connected to the conventional capacitance measurement device cannot precisely detect touches since it uses an inaccurate environment capacitance for comparison.

SUMMARY OF THE INVENTION

It is therefore a primary objective of the claimed invention to provide capacitance measurement device for a touch control device, for measuring the capacitance of a measured capacitor that is a trace of a touch panel of the touch control device.

The present invention discloses a capacitance measurement device for measuring the capacitance of a measured capacitor comprising a charging control unit for charging the measured capacitor, a discharging control unit for discharging the measured capacitor, a first switch coupled to the measured capacitor and the charging control unit, for controlling a connection between the measured capacitor and the charging control unit according to a first switching signal, a second switch coupled to the measured capacitor and the discharging control unit, for controlling a connection between the measured capacitor and the discharging control unit according to a second switching signal, a first analog-to-digital converter coupled to the measured capacitor, for converting a voltage signal on the measured capacitor into a first signal, and a duty cycle detecting circuit coupled to the measured capacitor, for converting the voltage signal on the measured capacitor into a count value that represents the capacitance of the measured capacitor and outputting the count value to a processing unit.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
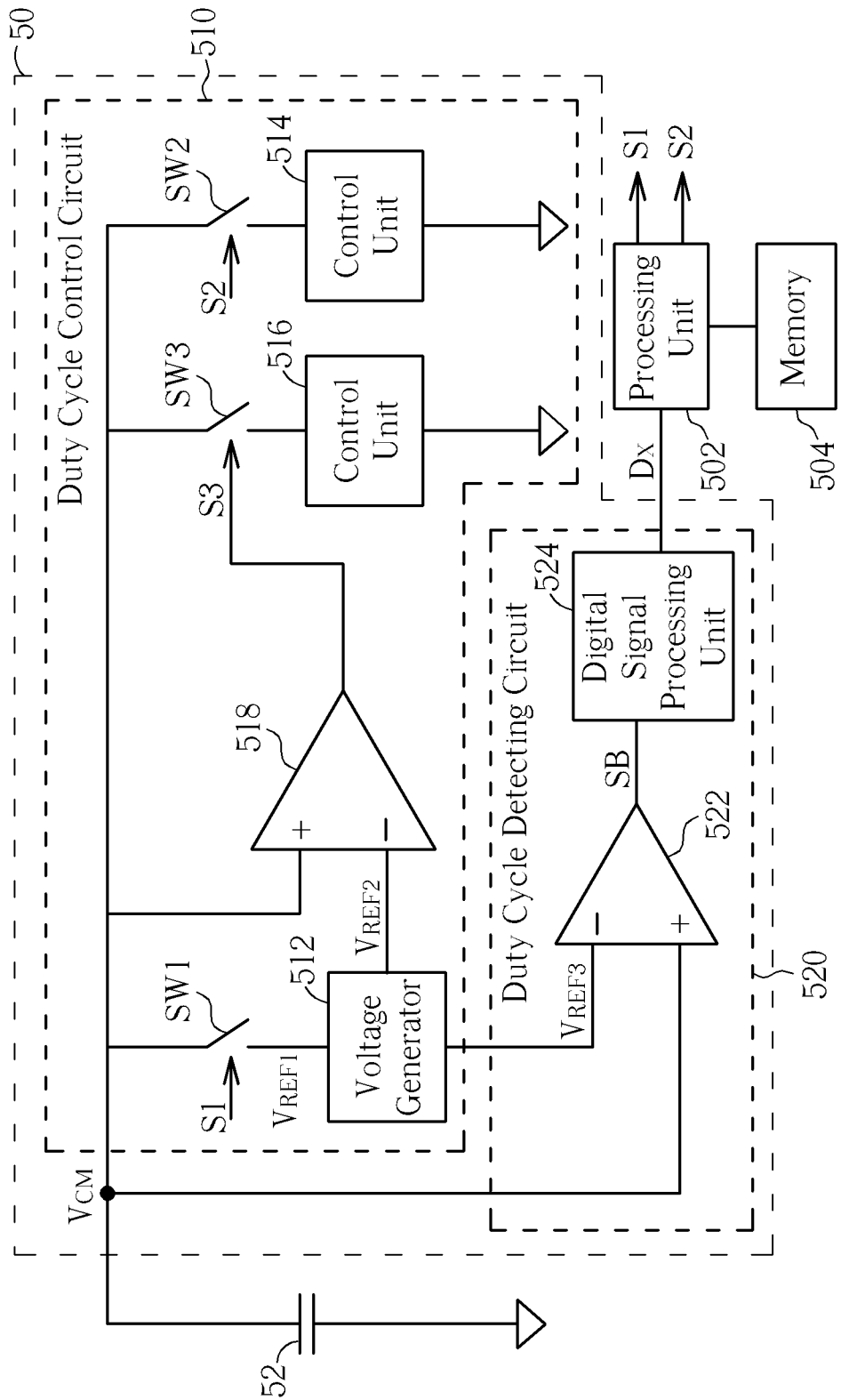
FIG. 5 is a schematic diagram of a capacitance measurement device according to an embodiment of the present invention.

Please refer to FIG. 5, which is a schematic diagram of a capacitance measurement device 50 according an embodiment of the present invention. The capacitance measurement device 50 is utilized for measuring the capacitance of each trace of a touch panel, where each trace is as a measured capacitor 52. A processing unit 502 and a memory 504 related to the capacitance measurement device 50 is also illustrated in FIG. 5. The capacitance measurement device 50 comprises a duty cycle control circuit 510 and a duty cycle detecting circuit 520. The duty cycle control circuit 510 comprises a voltage generator 512, control units 514 and 516, an analog-to-digital (A/D) converter 518, and switches SW1-SW3. The duty cycle detecting circuit 520 comprises an A/D converter 522 and a digital signal processing unit 524.

The duty cycle control circuit 510 is utilized for charging and discharging the measured capacitor 52. The voltage generator 512 is utilized for generating reference voltages $V_{REF1}$, $V_{REF2}$ and $V_{REF3}$. The control units 514 and 516 are a pair of units for charging and discharging respectively; one of the control units 514 and 516 is designed to be in a charging configuration for charging the measured capacitor 52, also called a charging control unit, and the other is designed to be in a discharging configuration for discharging the measured capacitor 52, also called a discharging control unit. When the charging capacity or the discharging capacity is adjusted, the charging period or discharging period changes accordingly. The control units 514 and 516 can be implemented by hardware, which is not limited to any specified circuitry but ensures that the charging capacity and the discharging capacity are adjustable. For example, a simple circuit composed of a switch and a variable capacitor can be used as a control unit in the charging configuration, in which the variable capacitor can be pre-charged to a predetermined voltage level and then is charge transferred. For another example, a variable current source or a voltage source parallel with resistors can also be used as the control unit in the charging configuration. A variable current source or a circuit composed of resistors connected to ground can be used as the control unit in the discharging configuration.

Please note that, the capacitor in the charging control unit has a very small capacitance and can be integrated in an ASIC of the capacitance measurement device 50, which is different from an external integrating capacitor for a conventional capacitance measurement device. In this situation, cost of the external integrating capacitor is not required and electromagnetic interference in the external integrating capacitor is avoided, and therefore capacitance measurement accuracy is improved.

The switch SW1 is coupled to the voltage generator 512 and the measured capacitor 52, and is utilized for controlling a connection between the reference voltage $V_{REF1}$ and the measured capacitor 52 according to a signal S1. When the switch SW1 is turned on by the signal S1, the reference voltage $V_{REF1}$ generated from the voltage generator 512 pre-charges the measured capacitor 52 to make the voltage level on the measured capacitor 52 equal to the reference voltage $V_{REF1}$, which is used for decreasing measurement error. The switch SW2 is coupled to the control unit 514 and the measured capacitor 52, and is utilized for controlling a connection between the control unit 514 and the measured capacitor 52 according to a signal S2. When the switch SW2 is turned on by the signal S2, the control unit 514 charges or discharges the measured capacitor 52, which depends on the charging configuration or the discharging configuration the control unit 514 is in.

The A/D converter 518 is a 1-bit A/D converter, equivalent to a comparator. The A/D converter 518 is coupled to the voltage generator 512 and the measured capacitor 52, and is utilized for converting the voltage signal $V_{CM}$ on the measured capacitor 52 into a signal S3 according to the reference voltage $V_{REF2}$. In other words, the A/D converter 518 compares the voltage level of the voltage signal $V_{CM}$ with the reference voltage $V_{REF2}$ and generates a comparison result as the signal S3. The switch SW3 is coupled to the A/D converter 518, the control unit 516, and the measured capacitor 52, and is utilized for controlling a connection between the control unit 516 and the measured capacitor 52 according to the signal S3. When the switch SW3 is turned on by the signal S3, the control unit 516 discharges or charges the measured capacitor 52, which depends on the discharging configuration or the charging configuration the control unit 516 is in.

The A/D converter 522 is a 1-bit A/D converter, equivalent to a comparator. The A/D converter 522 is coupled to the voltage generator 512 and the measured capacitor 52, and is utilized for converting the voltage signal $V_{CM}$ into a signal SB according to the reference voltage $V_{REF3}$. The digital signal processing unit 524 is coupled to the A/D converter 522, and is utilized for converting the signal SB into a count value Dx outputted to the processing unit 502 after several times of charging and discharging periods. The digital signal processing unit 524 operates as an accumulator to sample the signal SB by a sampling rate and accumulate sampling results. From the above, the duty cycle detecting circuit 520 converts the voltage signal $V_{CM}$ into the count value Dx. Since the waveform of the voltage signal $V_{CM}$ describes the charging and discharging period of the measured capacitor 52, the count value Dx generated based on the voltage signal $V_{CM}$ represents the charging and discharging period of the measured capacitor 52 and thereby represents the capacitance of the measured capacitor 52.

Note that, whether the control unit 514 or the control unit 516 is in the charging configuration or the discharging configuration affects the priority of charging and discharging. When the control unit 514 is the charging control unit and the control unit 516 is the discharging control unit, the capacitance measurement device 50 first charges the measured capacitor 52 and then discharges the measured capacitor 52, in which the control unit 514 and the control unit 516 are in a charge-discharge configuration. On the other hand, When the control unit 514 is the discharging control unit and the control unit 516 is the charging control unit, the capacitance measurement device 50 first discharges the measured capacitor 52 and then charges the measured capacitor 52, in which the control unit 514 and the control unit 516 are in a discharge-charge configuration. Signals with respect to the control unit 514 and the control unit 516 when in the charge-discharge configuration or the discharge-charge configuration are respectively illustrated in FIG. 6 and FIG. 7.

Figure 6:
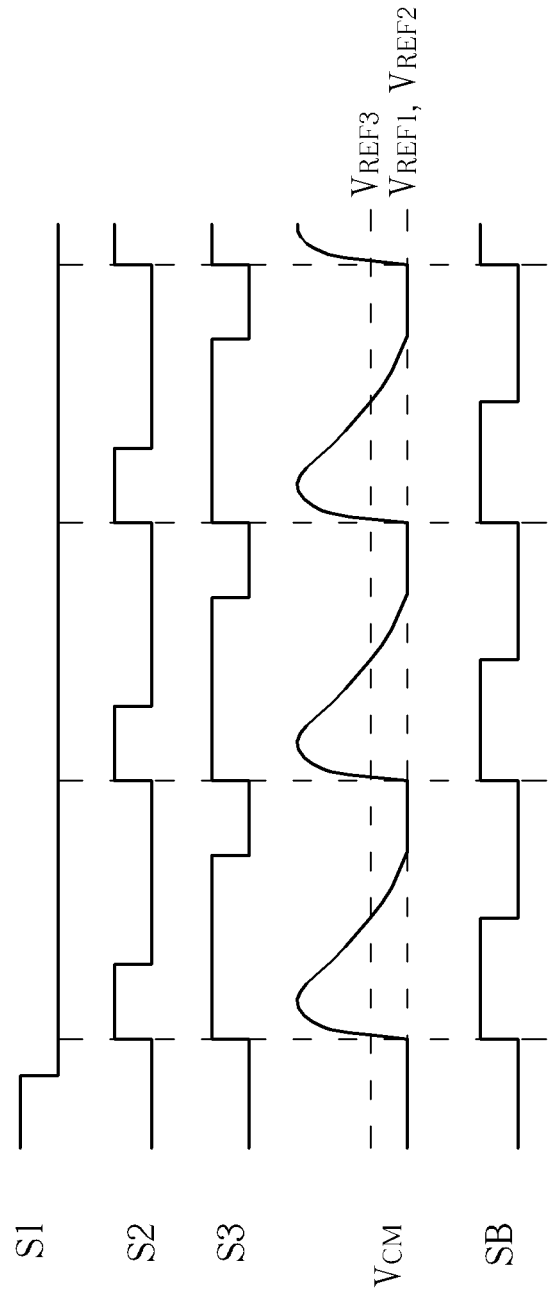
FIG. 6 is a timing diagram of signals with respect to the capacitance measurement device of FIG. 5 in a charge-discharge configuration.

FIG. 6 is a timing diagram of signals with respect to the capacitance measurement device 50 in the charge-discharge configuration performing a charging and discharging procedure, in which the signals S1-S3, the voltage signal $V_{CM}$, and the signal SB are illustrated. In the case of FIG. 6, the control unit 514 is the charging control unit, the control unit 516 is the discharging control unit, and the reference voltages are set to $V_{REF3} \geq V_{REF2} \approx V_{REF1}$. As shown in FIG. 6, the switch SW1 is turned on for a period of time when the charging and discharging procedure is initialized for pre-charging the measured capacitor 52 to reach the voltage level equal to the reference voltage $V_{REF1}$, and is turned off. When the switch SW2 is turned on, the control unit 514 performs charge transfer, to charge the measured capacitor 52. Since the reference voltage $V_{REF2}$ is close to the reference voltage $V_{REF1}$, the voltage level of the voltage signal $V_{CM}$ soon rises to be equal to or higher than the reference voltage $V_{REF2}$. At the same time, the switch S3 is turned on by the signal S3 outputted from the A/D converter 518 so that the control unit 516 starts to discharge the measured capacitor 52. The control unit 516 discharges the measured capacitor 52 until the switch SW3 is turned off when the voltage level of the voltage signal $V_{CM}$ decreases to be lower than or equal to the reference voltage $V_{REF2}$. Note that, the time between when the control unit 514 performs charging transfer and when the control unit 516 stops discharging is regarded as a charging and discharging period. After the control unit 514 and the control unit 516 operate for a predetermined time of several charging and discharging periods, the digital signal processing unit 524 converts the signal SB into the count value Dx.

Note that, the reference voltages setting $V_{REF3} \geq V_{REF2} \approx V_{REF1}$ in the example of FIG. 6 is one of embodiments of the present invention. The reference voltages setting can be $V_{REF3} \geq V_{REF2} \geq V_{REF1}$ for the case when the measured capacitor 52 has a large capacitance when the capacitance measurement device 50 is in the charge-discharge configuration. In such as situation of $V_{REF3} \geq V_{REF2} \geq V_{REF1}$, the control unit 514 needs to perform charge transfer for much more time in order to charge the measured capacitor 52 and make the voltage signal $V_{CM}$ to reach a voltage level higher than the reference voltages $V_{REF3}$ and $V_{REF2}$.

Figure 7:
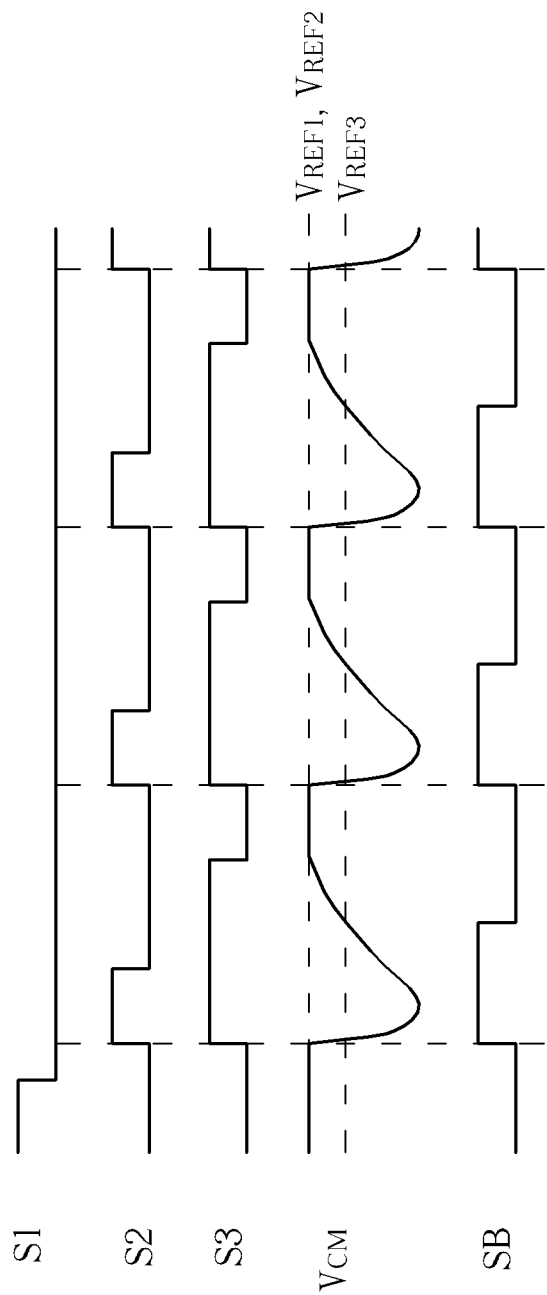
FIG. 7 is a timing diagram of signals with respect to the capacitance measurement device of FIG. 5 in a discharge-charge configuration.

FIG. 7 is a timing diagram of signals with respect to the capacitance measurement device 50 in the discharge-charge configuration performing a charging and discharging procedure. In the case of FIG. 7, the control unit 514 is the discharging control unit, the control unit 516 is the charging control unit, and the reference voltages are set to $V_{REF3} \leq V_{REF2} \approx V_{REF1}$. As shown in FIG. 7, the switch SW1 is turned on for a period of time when the charging and discharging procedure is initialized for pre-charging the measured capacitor 52 to reach the voltage level of the reference voltage $V_{REF1}$. When the switch SW2 is turned on, the control unit 514 performs charge transfer to discharge the measured capacitor 52. When the voltage level of the voltage signal $V_{CM}$ decreases to be lower than or equal to the reference voltage $V_{REF2}$, the switch SW3 is turned on by the signal S3 and the control unit 516 starts to charge the measured capacitor 52. The control unit 516 charges the measured capacitor 52 until the switch SW3 is turned off when the voltage level of the voltage signal $V_{CM}$ increases to be higher than or equal to the reference voltage $V_{REF2}$. Also, after the control units 514 and the control unit 516 operate for several charging and discharging periods, the digital signal processing unit 524 converts the signal SB into the count value Dx. Note that, the reference voltages setting $V_{REF3} \leq V_{REF2} \approx V_{REF1}$ in the example of FIG. 7 is one of embodiments of the present invention. The reference voltages setting can be $V_{REF3} \leq V_{REF2} \leq V_{REF1}$ for the case when the measured capacitor 52 has a large capacitance when the capacitance measurement device 50 is in the discharge-charge configuration.

Figure 1:
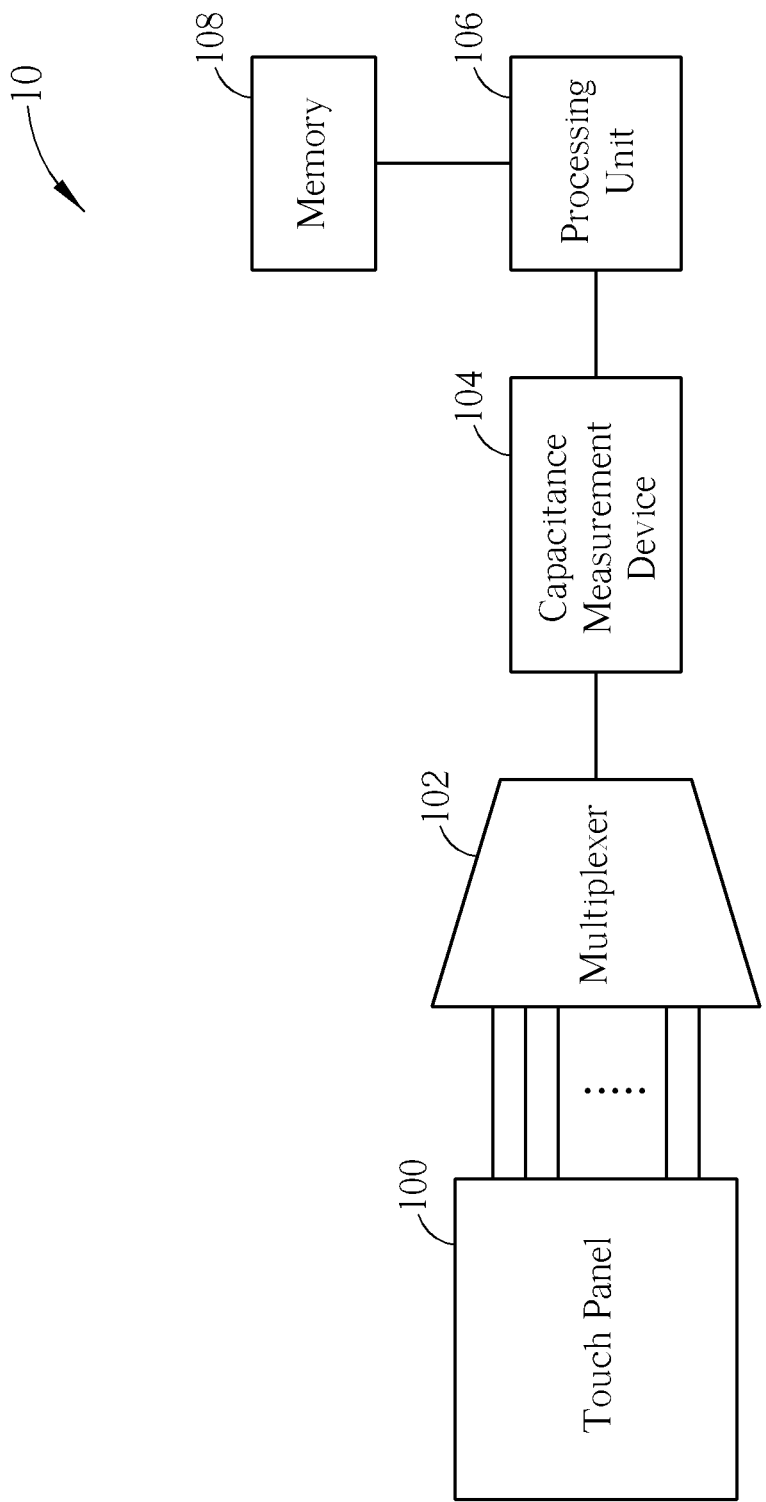
FIG. 1 is a schematic diagram of a touch control device according to the prior art.
Figure 2:
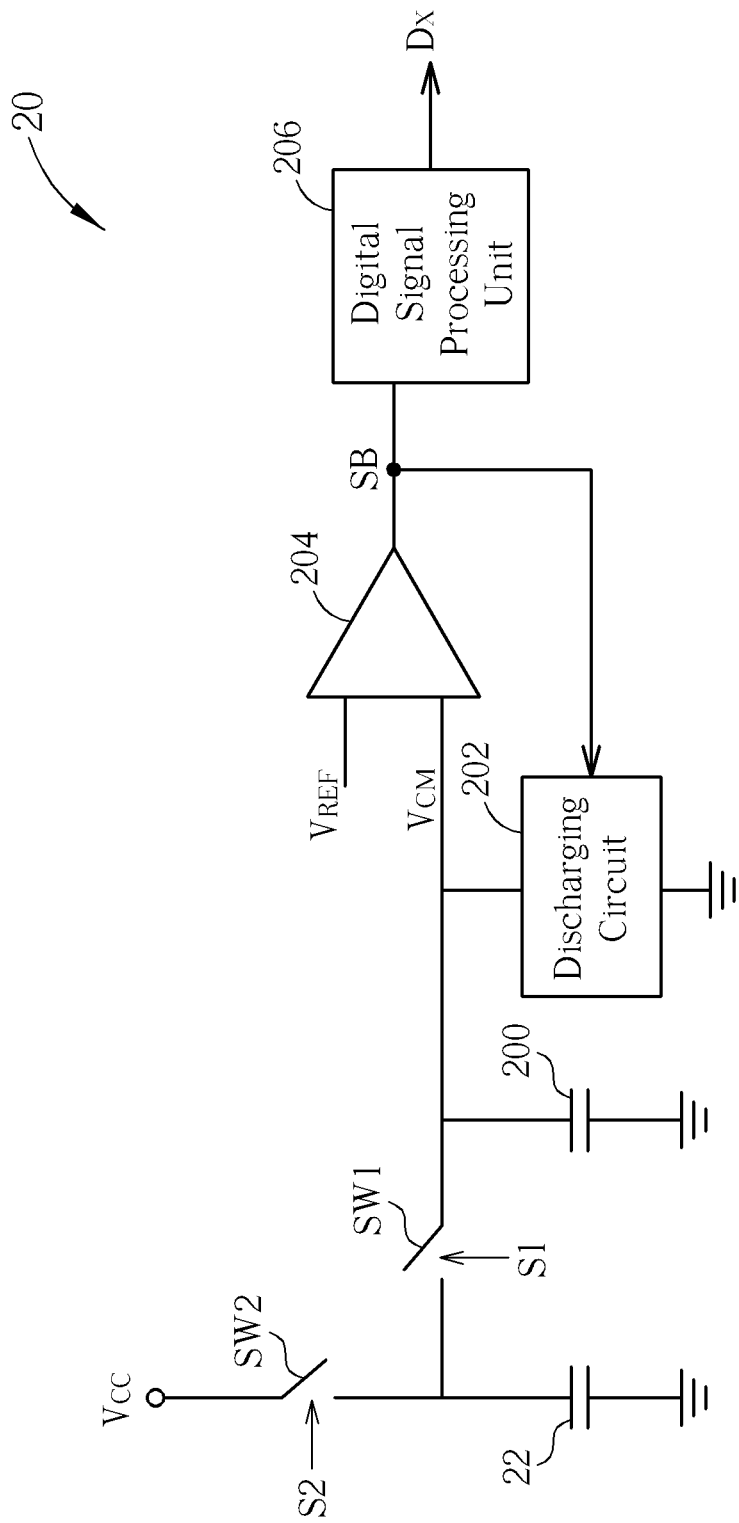
FIG. 2 is a schematic diagram of a capacitance measurement device based on a delta-sigma method according to the prior art.
Figure 3:
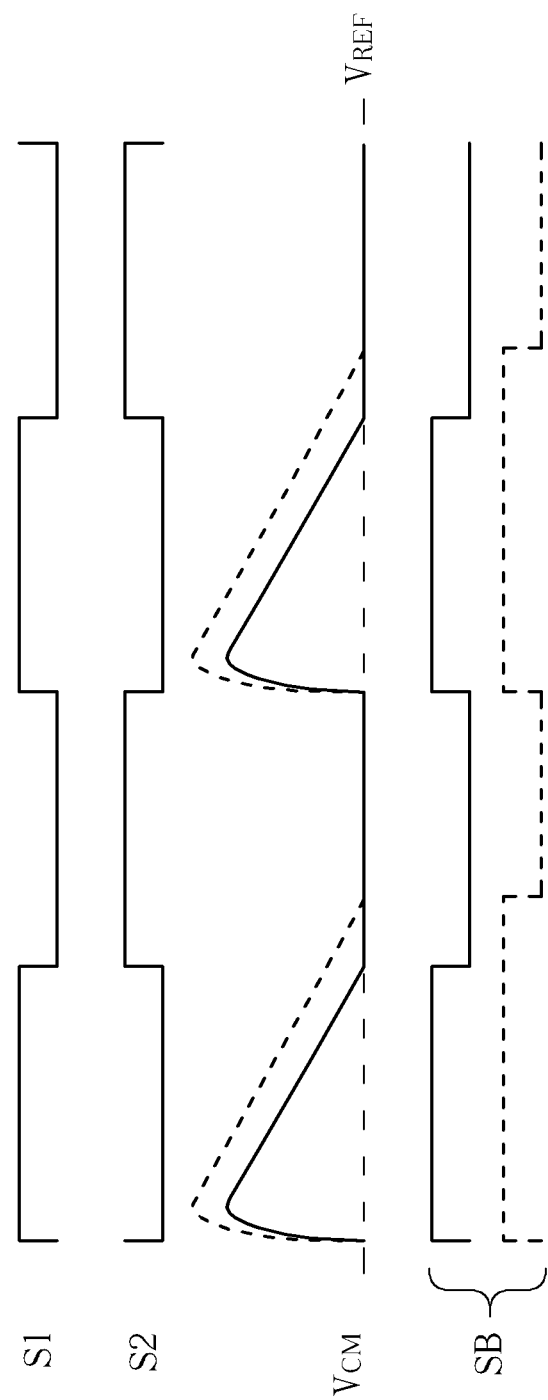
FIG. 3 and FIG. 4 are timing diagrams of signals with respect to the capacitance measurement device of FIG. 2 performing a charging a d discharging procedure.
Figure 4:
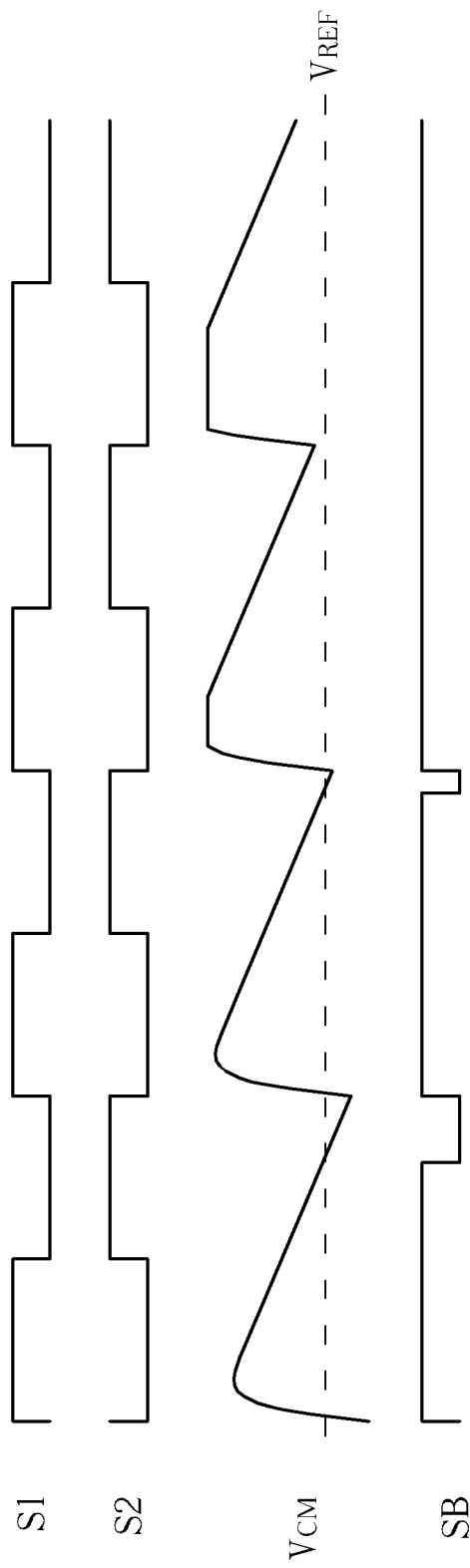

The processing unit 502 is coupled to the control units 514 and 516, the digital signal processing unit 524, and the memory 504. The memory 504 is utilized for storing a base count value corresponding to the environment capacitor. The processing unit 502 is utilized for determining if a touch happens according to the difference between the count value Dx and the base count value stored in the memory 504 and for adjusting the charging capacity or the discharging capacity the duty cycle control circuit 510 uses according to the count value Dx, which is not similar to the fixed charging/discharging capacity that the capacitance measurement device 20 of FIG. 2 can provide. In addition, the signals S1 and S2 for controlling the switches SW1 and SW2 are generated by the processing unit 502.

In detail, the processing unit 502 determines that the count value Dx is too large or small, which indicates that the environment capacitor may change, based on an acceptable predetermined range DL-DU and adjusts the charging capacity or the discharging capacity accordingly. The predetermined range DL-DU can be defined according to a maximum count value that the processing unit 502 possibly receives. For example, the upper bound DU is set to 80% of the maximum count value and the lower bound DL is set to 20% of the maximum count value. When the count value Dx is larger than the upper bound DU, the processing unit 502 determines that the count value Dx is too large to be acceptable and thereby degrades the charging capacity or upgrades the discharging capacity. When the count value Dx is smaller than the lower bound DL, the processing unit 502 determines that the count value Dx is too small to be acceptable and thereby upgrades the charging capacity or degrades the discharging capacity. The processing unit 502 performs adjustment to the charging/discharging capacity until the received count value Dx falls in the predetermined range DL-DU, which means that the charging/discharging capacity at the moment is proper to be used.

Figure 8:
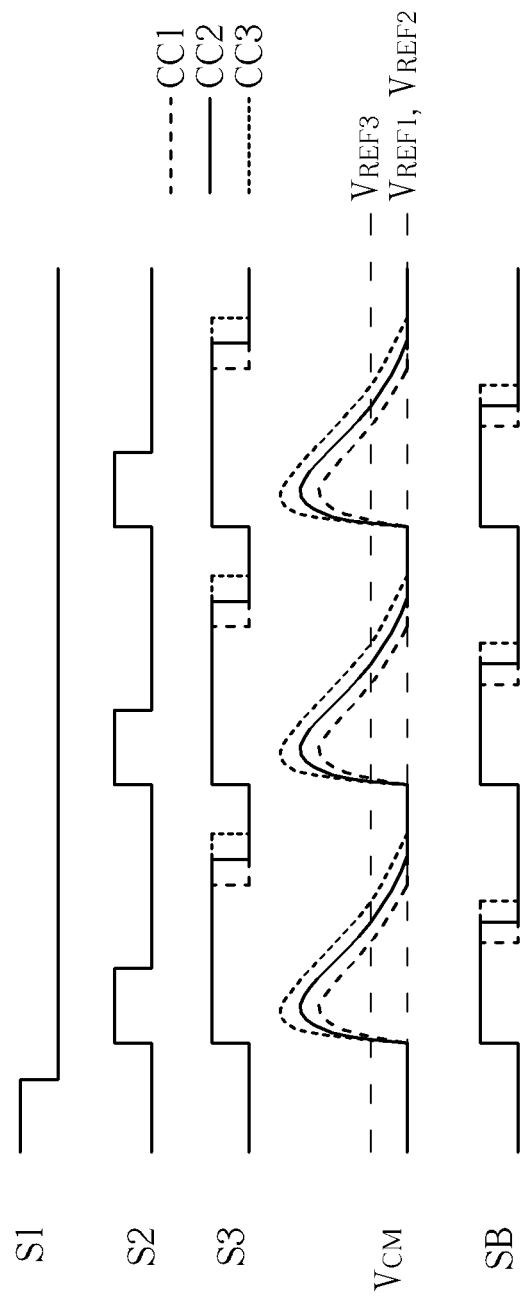
FIG. 8 is a timing diagram of signals with respect to the capacitance measurement device of FIG. 5 for an illustration of adjustable charging capacity.

Please refer to FIG. 8, which is a timing diagram of signals with respect to the capacitance measurement device 50 in the charge-discharge configuration performing a charging and discharging procedure. In the case of FIG. 8, the control unit 514 is assumed to have an adjustable charging capacity with three levels CC1, CC2, and CC3, and CC1<CC2<CC3. Waveforms corresponding to the charging capacities CC1, CC2 and CC3 are depicted by a long-dashed line, a solid line, and a short-dashed line respectively. When the control unit 514 charges the measured capacitor 52 by using the charging capacity CC2 and the processing unit 502 determines that the count value Dx is larger than the upper bound of the predetermined range, which indicates that the duty cycle of the signal SB is too high, the processing unit 502 degrades the charging capacity from CC2 to CC1. As shown in FIG. 8, when the charging capacity CC1 is used, the voltage level of the voltage signal $V_{CM}$ rises gradually, not steeply as when the charging capacity CC2 is used. After the charging capacity is adjusted, the duty cycle of the signal SB decreases, and the duty cycle detecting circuit 520 generates a smaller count value Dx accordingly.

Similarly, when the control unit 514 charges the measured capacitor 52 by using the charging capacity CC2 and the processing unit 502 determines that the count value Dx is smaller than the lower bound of the predetermined range, which indicates that the duty cycle of the signal SB is too low, the processing unit 502 upgrades the charging capacity from CC2 to CC3. As shown in FIG. 8, when the charging capacity CC3 is used, the duty cycle of the signal SB is higher compared with the duty cycle when the charging capacity CC2 is used, and in this situation, the duty cycle detecting circuit 520 generates a larger count value Dx. After one or several times of charging capacity adjustments, the processing unit 502 determines a proper charging capacity for the control unit 514.

Figure 9:
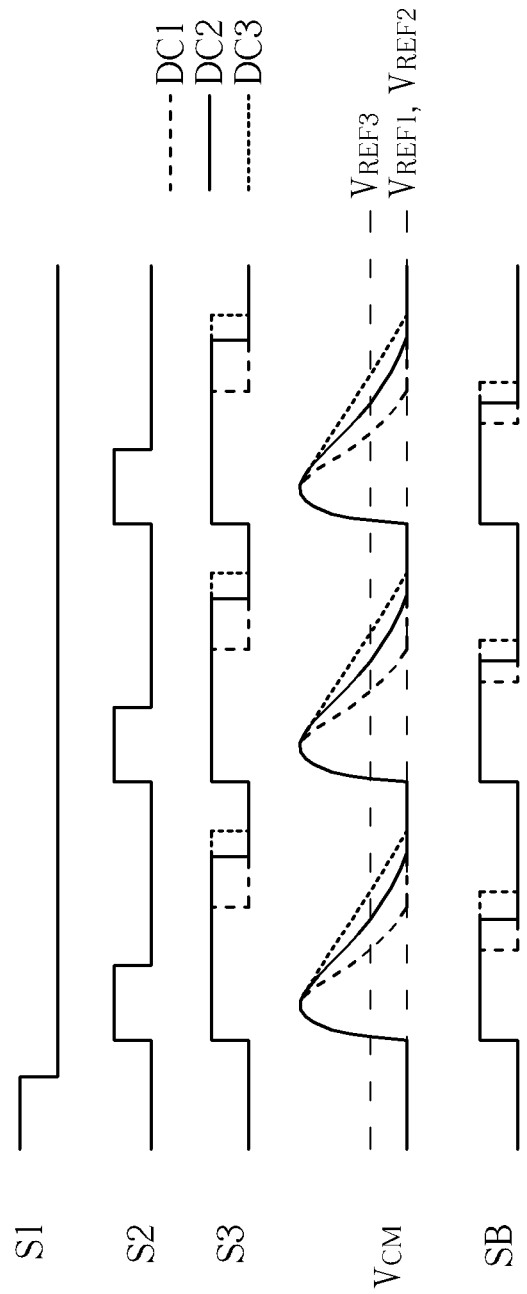
FIG. 9 is a timing diagram of signals with respect to the capacitance measurement device of FIG. 5 for an illustration of adjustable discharging capacity.

Please refer to FIG. 9, which is a timing diagram of signals with respect to the capacitance measurement device 50 in the charge-discharge configuration performing a charging and discharging procedure. In the case of FIG. 9, the control unit 516 is assumed to have an adjustable discharging capacity with three levels DC1, DC2, and DC3, and DC1>DC2>DC3. Waveforms corresponding to the discharging capacities DC1, DC2 and DC3 are depicted by a long-dashed line, a solid line, and a short-dashed line respectively. When the control unit 516 discharges the measured capacitor 52 by using the discharging capacity DC2 and the processing unit 502 determines that the count value Dx is larger than the upper bound of the predetermined range, which indicates that the duty cycle of the signal SB is too high, the processing unit 502 upgrades the discharging capacity from DC2 to DC1 to shorten the discharging period. When the discharging capacity DC1 is used, the voltage level of the voltage signal $V_{CM}$ falls below the reference voltage $V_{REF3}$ more quickly than it does when the discharging capacity DC2 is used, and the duty cycle of the signal SB is comparatively low. Therefore, the duty cycle detecting circuit 520 generates a smaller count value Dx accordingly.

Similarly, when the control unit 516 discharges the measured capacitor 52 by the discharging capacity DC2 and the processing unit 502 determines that the count value Dx is smaller than the lower bound of the predetermined range, which indicates that the duty cycle of the signal SB is too low, the processing unit 502 degrades the discharging capacity from DC2 to DC3 to extend the discharging period. As a result, the duty cycle of the signal SB increases, and the duty cycle detecting circuit 520 generates a larger count value Dx accordingly. After one or several times of discharging capacity adjustments, the processing unit 502 determines a proper discharging capacity for the control unit 516.

FIG. 8 and FIG. 9 illustrate the relationship between the charging/discharging capacity and the duty cycle of the signal SB for the capacitance measurement device 50 in the charge-discharge configuration. In a similar manner, for the capacitance measurement device 50 in the discharge-charge configuration, the processing unit 502 can also adjust the discharging capacity of the control unit 514 or the charging capacity of the control unit 516, which are omitted herein.

When the environment capacitance of the trace of a touch panel changes due to temperature/humidity variance or dust on the touch panel, the conventional capacitance measurement device may generate a count value out of an acceptable range, which is not proper for determining if a touch happens; and moreover, the charging/discharging capacity used in the conventional capacitance measurement device is not adjustable. Therefore, the processing unit in the touch control device using the conventional capacitance measurement device cannot receive a count value that precisely represents the capacitance of the measured capacitor, and the touch event cannot be detected precisely.

In comparison, for the touch control device using the capacitance measurement device 50, when the count value Dx generated from the capacitance measurement device 50 is too large or too small, the processing unit 502 adjusts the charging/discharging capacity of the duty cycle control circuit 510 according to the count value Dx, so that the charging/discharging capacity is properly used for a current environment of the touch panel. After the charging/discharging capacity is adjusted, the count value Dx can fall in the acceptable predetermined range, and the capacitance of the measured capacitor is precisely measured.

Figure 10:
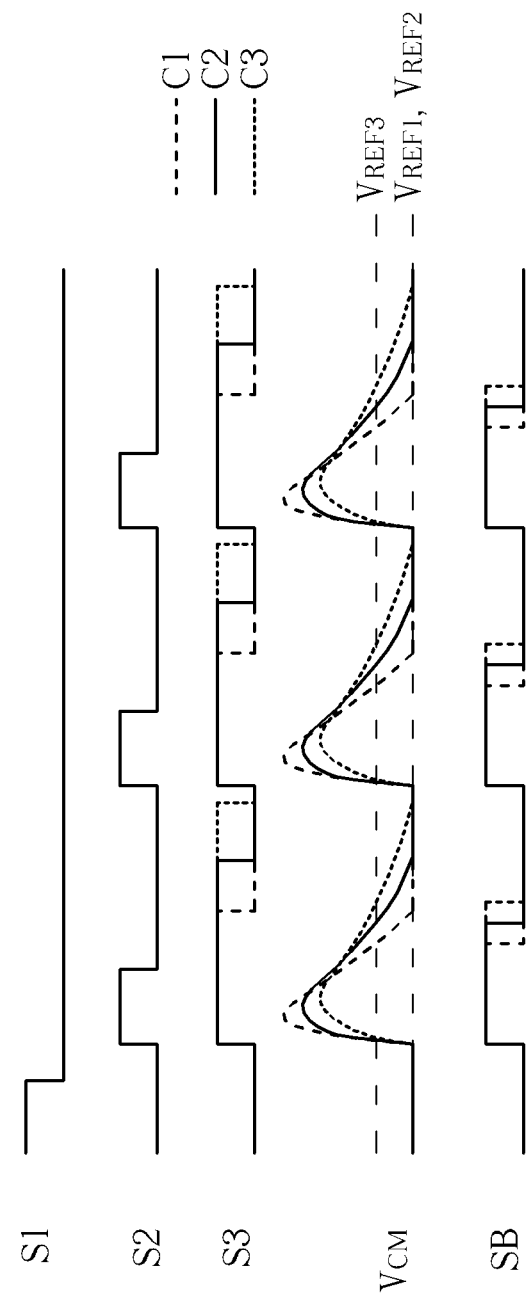
FIG. 10 is a timing diagram of signals with respect to the capacitance measurement device of FIG. 5 under different measured capacitances.

Please refer to FIG. 10, which is a timing diagram of signals with respect to the capacitance measurement device 50 in the charge-discharge configuration performing a charging and discharging procedure. In FIG. 10, waveforms corresponding to the measured capacitor of different capacitances C1, C2 and C3 are depicted by a long-dashed line, a solid line, and a short-dashed line respectively, and C1<C2<C3. According to the principle V=Q/C, when the capacitance of the measured capacitor 52 increases from C2 to C3 and the charging capacity is not changed, the maximum voltage level of the voltage signal $V_{CM}$ decreases; and when the capacitance of the measured capacitor 52 decreases from C2 to C1 and the charging capacity is not changed, the maximum voltage level of the voltage signal $V_{CM}$ increases. In another aspect based on the principle of RC time constant, when the capacitance of the measured capacitor 52 increases from C2 to C3, the required discharging period is extended and the duty cycle of the signal SB increases; and when the capacitance of the measured capacitor 52 decreases from C2 to C1, the required discharging period is shortened and the duty cycle of the signal SB decreases. From the above, the duty cycle of the signal SB represents the capacitance of the measured capacitor 52. In another embodiment of the present invention, the capacitance measurement device 50 in the discharge-charge configuration can also knows that the duty cycle of the signal SB represents the capacitance of the measured capacitor 52, which is omitted herein.

Briefly, the capacitance measurement device 50 charges the measured capacitor 52 and converts the voltage signal $V_{CM}$ on the measured capacitor 52 into the count value Dx outputted to the processing unit 502, and the processing unit 502 determines whether the charging/discharging capacity requires to be adjusted according to the count value Dx. Because the capacitance measurement device 50 uses a proper charging/discharging capacity that is decided according to the current environment capacitance of the touch panel, the capacitance measurement device 50 is suitable for touch panels of different characteristics for detecting touches.

Figure 11:
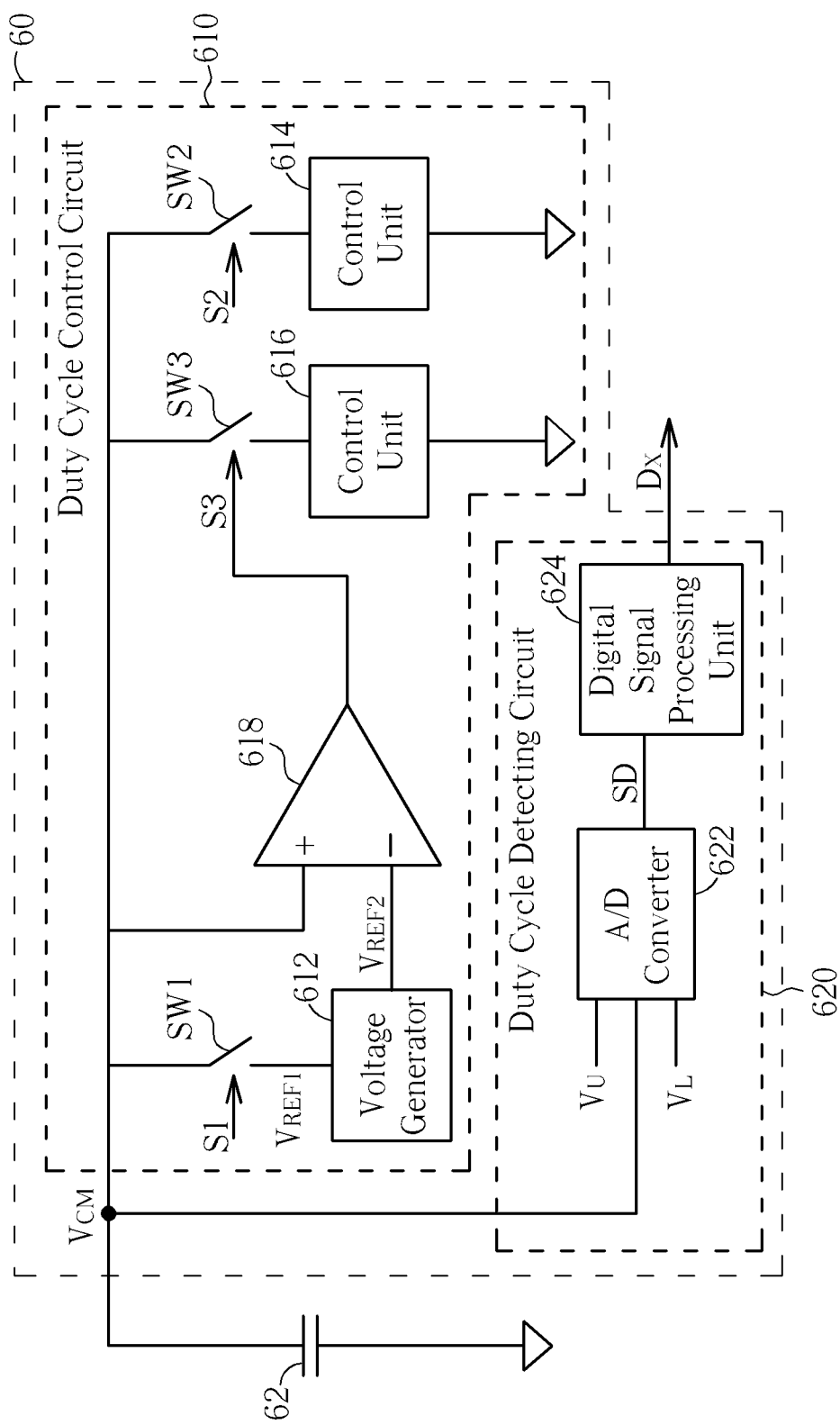
FIG. 11 is a schematic diagram of a capacitance measurement device according to an embodiment of the present invention.

The capacitance measurement device 50 of FIG. 5 is one of embodiments of the present invention, and those skilled in the art can make alterations and modifications accordingly. Please refer to FIG. 11, which is a schematic diagram of a capacitance measurement device 60 according an embodiment of the present invention. The capacitance measurement device 60 comprises a duty cycle control circuit 610 and a duty cycle detecting circuit 620. The duty cycle control circuit 610 comprises a voltage generator 612, control units 614 and 616, an A/D converter 618, and switches SW1-SW3. The duty cycle detecting circuit 620 comprises an A/D converter 622 and a digital signal processing unit 624. Please note that, the A/D converter 622 is an N-bit A/D converter and N>1, different from the 1-bit A/D converter 522 in the capacitance measurement device 50. Units in the capacitance measurement device 60 other than the A/D converter 622 are similar to those corresponding units in the capacitance measurement device 50 and are not detailed described herein.

The A/D converter 622 is coupled to a measured capacitor 62 and the digital signal processing unit 624, and is utilized for converting the voltage signal $V_{CM}$ on the measured capacitor 62 into an N-bit signal SD according to reference voltages in a range from a reference voltage $V_L$ to a reference voltage V. The signal SD is outputted to the digital signal processing unit 624. When the capacitance measurement device 60 is in the charge-discharge configuration, which indicates that the control unit 614 is the charging control unit and the control unit 616 is the discharging control unit, the reference voltage range $V_L$-$V_u$ is set to be higher than the reference voltage $V_{REF1}$ generated by the voltage generator 612 for pre-charging and the reference voltage $V_{REF2}$ used by the A/D converter 618. On the other hand, when the capacitance measurement device 60 is in the discharge-charge configuration, which indicates that the control unit 614 is the discharging control unit and the control unit 616 is the charging control unit, the reference voltage range $V_L$-$V_U$ is set to be lower than the reference voltages $V_{REF1}$ and $V_{REF2}$. The digital signal processing unit 624 converts the signal SD into a count value Dx and outputs the count value Dx to a rear-stage processing unit (which is not shown in FIG. 11) for charging/discharging capacity adjustment.

Figure 12:
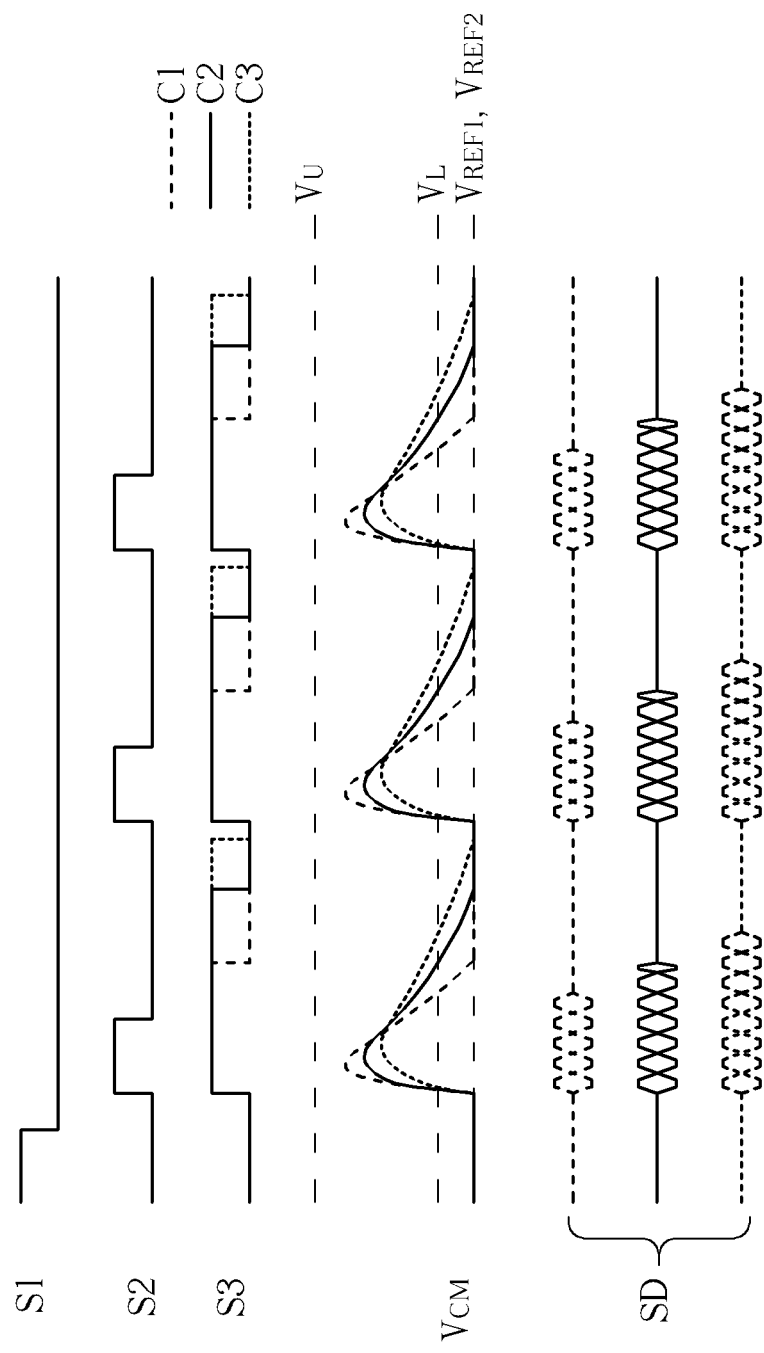
FIG. 12 is a timing diagram of signals with respect to the capacitance measurement device of FIG. 11 in a charge-discharge configuration under different measured capacitances.
Figure 13:
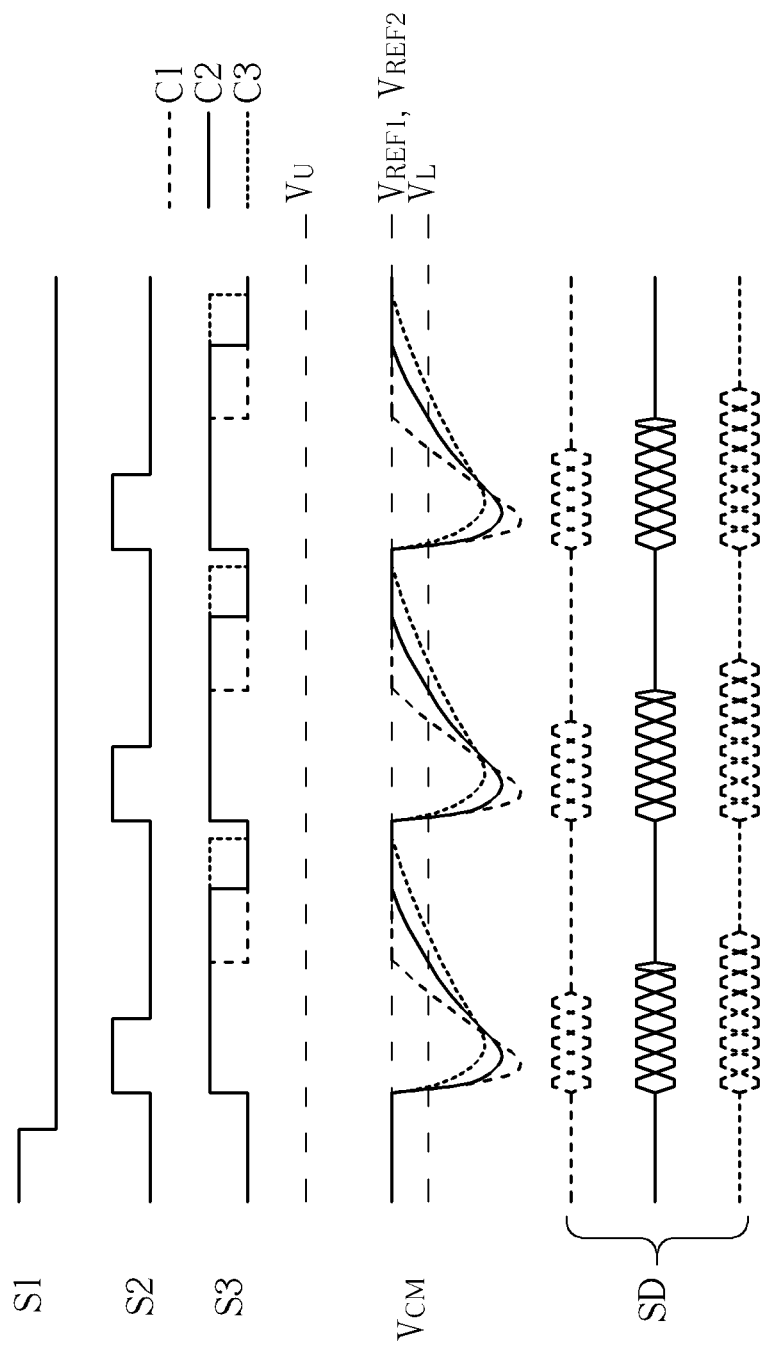
FIG. 13 is a timing diagram of signals with respect to the capacitance measurement device of FIG. 11 in a discharge-charge configuration under different measurement capacitances.

FIG. 12 and FIG. 13 are timing diagrams of signals with respect to the capacitance measurement device 60 in the charge-discharge configuration and in the discharge-charge configuration respectively, performing a charging and discharging procedure, in which signals S1-S3 controlling the switches SW1-SW3, the voltage signal $V_{CM}$ and the signal SD are illustrated. Waveforms of the signal S3, the voltage signal $V_{cm}$, and the signal SD are depicted by a long-dashed line, a solid line, and a short-dashed line for indicating cases of different measured capacitance C1, C2 and C3, and C1<C2<C3. As shown in FIG. 12 and FIG. 13, the duty cycle of the signal SD represents the measured capacitance. Therefore, the rear-stage processing unit can adjust the charging/discharging capacity of the control unit 614 or the control unit 616 according to the count value Dx.

Figure 14:
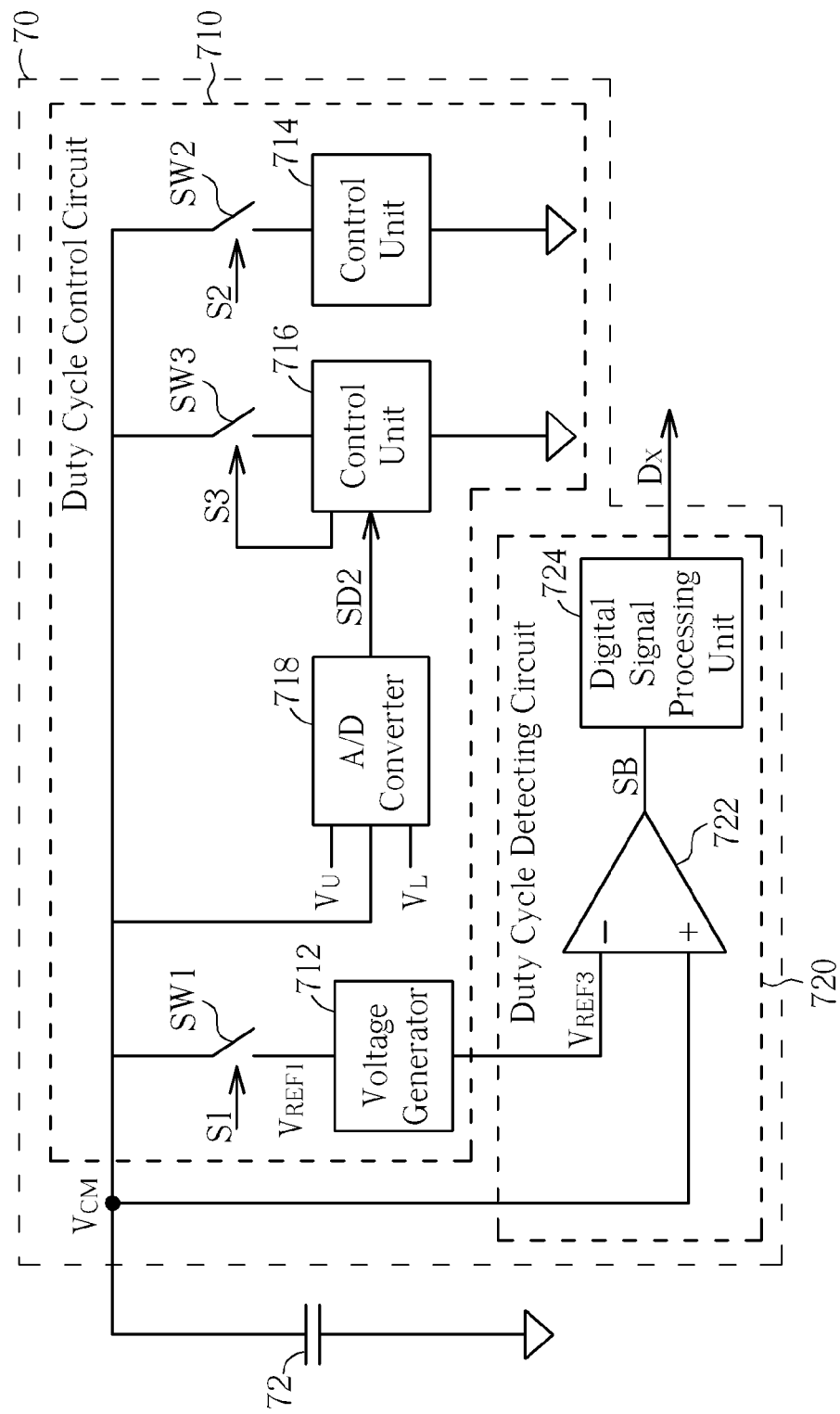
FIG. 14 is a schematic diagram of a capacitance measurement device according to an embodiment of the present invention.

In the capacitance measurement device 50 of FIG. 5, the charging/discharging capacity of the control unit 516 is adjusted by the processing unit 502 according to the count value Dx. In another embodiment of the present invention, the charging/discharging capacity of the control units in charge-discharge configuration or in discharge-charge configuration is adjusted according to the voltage on the measured capacitor and is not adjusted by the rear-stage processing unit. Please refer to FIG. 14, which is a capacitance measurement device 70 according to an embodiment of the present invention. The capacitance measurement device 70 comprises a duty cycle control circuit 710 and a duty cycle detecting circuit 720. The duty cycle control circuit 710 comprises a voltage generator 712, control units 714 and 716, an A/D converter 718, and switches SW1-SW3. The duty cycle detecting circuit 720 comprises an A/D converter 722 and a digital signal processing unit 724.

The difference between the capacitance measurement device 70 and the capacitance measurement device 50 is that the A/D converter 718 is an N-bit A/D converter and N>1, not a 1-bit A/D converter. The A/D converter 718 is coupled to a measured capacitor 72 and the control unit 716, and is utilized for converting the voltage signal $V_{CM}$ on the measured capacitor 72 into an N-bit signal SD2 outputted to the control unit 716. The A/D converter 718 uses reference voltages in a range from a reference voltage signal $V_L$ to a reference voltage signal $V_U$. The control unit 716 selects a charging capacity (or a discharging capacity, depending on the charging or discharging configuration the control unit 716 is) among $2^N$ different capacity settings according to the signal SD2, to charge/discharge the measured capacitor 72. Compared to the capacitance measurement device 50 of FIG. 5, the charging/discharging capacity of the control unit 716 is set according to the signal SD2 instead of being decided by a rear-stage processing unit according to the count value generated from the duty cycle detecting circuit 720.

Please note that, the connection between the control unit 716 and the measured capacitor 72 is controlled by a signal S3 outputted from the control unit 716, not controlled by the signal SD2. Please refer to the capacitance measurement device 50 to realize how the charging/discharging capacity of the control unit 714 is adjusted, which is omitted herein.

In conclusion, the capacitance measurement device according to the present invention converts the voltage signal on the measured capacitor into a count value that is used for adjusting the charging/discharging capacity of the measured capacitor. Therefore, when the environment capacitance of the touch panel varies due to external environmental factors, or when the touch panels have different environment capacitors, the capacitance measurement device according to the present invention is proper to be used to charge/discharge the measured capacitor, so that the capacitance of the measured capacitor is precisely measured.

Those skilled in the art will readily observe that numerous modifications and alterations of the device and method may be made while retaining the teachings of the invention.

What is claimed is:

1. A capacitance measurement device for measuring the capacitance of a measured capacitor comprising:
   a charging control unit for charging the measured capacitor;
   a discharging control unit for discharging the measured capacitor;
   a first switch coupled between the measured capacitor and the charging control unit, for controlling a connection between the measured capacitor and the charging control unit according to a first switching signal;
   a second switch coupled between the measured capacitor and the discharging control unit, for controlling a connection between the measured capacitor and the discharging control unit according to a second switching signal;
   a first analog-to-digital (A/D) converter coupled to the measured capacitor, for converting a voltage signal on the measured capacitor into a first signal; and
   a duty cycle detecting circuit coupled to the measured capacitor, for converting the voltage signal on the measured capacitor into a count value that represents the capacitance of the measured capacitor and outputting the count value to a processing unit;
   wherein at least one of the charge control unit and the discharge control unit sets a discharge/charging capacity for discharging/charging the measured capacitor according to the first signal.

2. The capacitance measurement device of claim 1 further comprising:
   a voltage generator coupled to the first A/D converter and the duty cycle detecting circuit, for generating a plurality of reference voltages used by the first A/D converter and the duty cycle detecting circuit; and
   a third switch coupled to the measured capacitor and the voltage generator, for controlling a connection between the measured capacitor and the voltage generator according to a third switching signal.

3. The capacitance measurement device of claim 2, wherein the voltage generator pre-charges the measured capacitor to a predetermined voltage level before the charging control unit charges the measured capacitor and the discharging unit discharges the measured capacitor.

4. The capacitance measurement device of claim 3, wherein the predetermined voltage approximates a reference voltage used by the first A/D converter.

5. The capacitance measurement device of claim 2, wherein the third switching signal is generated by the processing unit.

6. The capacitance measurement device of claim 1, wherein the first A/D converter is a 1-bit A/D converter and is further coupled to the second switch, and the first signal generated by the first A/D converter is the second switching signal.

7. The capacitance measurement device of claim 6, wherein the first switching signal is generated by the processing unit.

8. The capacitance measurement device of claim 1, wherein the first A/D converter is a 1-bit A/D converter and is further coupled to the first switch, and the first signal generated by the first A/D converter is the first switching signal.

9. The capacitance measurement device of claim 8, wherein the second switching signal is generated by the processing unit.

10. The capacitance measurement device of claim 1, wherein the first A/D converter is an N-bit A/D converter and is further coupled to the discharging control unit, and the discharging control unit sets the a discharging capacity for discharging the measured capacitor by selecting from a plurality of discharging capacities according to the first signal, where N is an integer larger than 1.

11. The capacitance measurement device of claim 10, wherein the first switching signal is generated by the processing unit and the second switching signal is generated by the discharging control unit.

12. The capacitance measurement device of claim 1, wherein the first A/D converter is an N-bit A/D converter and is further coupled to the charging control unit, and the charging control unit sets the a charging capacity for charging the measured capacitor by selecting from a plurality of charging capacities according to the first signal, where N is an integer larger than 1.

13. The capacitance measurement device of claim 12, wherein the first switching signal is generated by the charging control unit and the second switching signal is generated by the processing unit.

14. The capacitance measurement device of claim 1, where the duty cycle detecting circuit comprises:
    a second A/D converter coupled to the measured capacitor, for converting the voltage signal on the measured capacitor into a second signal; and
    a digital signal processing unit coupled to the second A/D converter, for converting the second signal into the count value.

15. The capacitance measurement device of claim 14, wherein the second A/D converter is a 1-bit A/D converter.

16. The capacitance measurement device of claim 14, wherein the second A/D converter is an N-bit A/D converter, where N is an integer larger than 1.

17. The capacitance measurement device of claim 1, wherein the processing unit is utilized for determining a charging capacity used by the charging control unit.

18. The capacitance measurement device of claim 1, wherein the processing unit is utilized for adjusting a discharging capacity used by the discharging control unit.

19. A capacitance measurement device for measuring the capacitance of a measured capacitor comprising:
    a charging control unit for charging the measured capacitor;
    a discharging control unit for discharging the measured capacitor;
    a first switch coupled between the measured capacitor and the charging control unit, for controlling a connection between the measured capacitor and the charging control unit according to a first switching signal;
    a second switch coupled between the measured capacitor and the discharging control unit, for controlling a connection between the measured capacitor and the discharging control unit according to a second switching signal;
    a first analog-to-digital (A/D) converter coupled to the measured capacitor, for converting a voltage signal on the measured capacitor into a first signal; and
    a duty cycle detecting circuit coupled to the measured capacitor, for converting the voltage signal on the measured capacitor into a count value that represents the capacitance of the measured capacitor and outputting the count value to a processing unit;
    wherein in a first period one of the first and second switches is turned on such that one of the charging control unit and the discharge control unit charges/discharges the measured capacitor and in a second period after the first period the other one of the first and second switches is turned on such that the other one of the charging control unit and the discharge control unit discharges/charges the measured capacitor.

* * * * *